(12) United States Patent
Derner et al.

(10) Patent No.: US 10,825,501 B2
(45) Date of Patent: *Nov. 3, 2020

(54) PRE-WRITING MEMORY CELLS OF AN ARRAY

(71) Applicant: Micron Technology, Inc., Boise, ID (US)

(72) Inventors: Scott James Derner, Boise, ID (US); Christopher John Kawamura, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/537,090

(22) Filed: Aug. 9, 2019

(65) Prior Publication Data

US 2020/0035286 A1 Jan. 30, 2020

Related U.S. Application Data

(63) Continuation of application No. 16/109,339, filed on Aug. 22, 2018, now Pat. No. 10,388,354, which is a (Continued)

(51) Int. Cl.
*G11C 11/22* (2006.01)
*G06F 3/06* (2006.01)

(52) U.S. Cl.
CPC ........ *G11C 11/2275* (2013.01); *G06F 3/0619* (2013.01); *G06F 3/0665* (2013.01); (Continued)

(58) Field of Classification Search
CPC ............ G11C 11/2275; G11C 11/2257; G11C 11/2273; G06F 3/0665; G06F 3/0619; G06F 3/0689
See application file for complete search history.

(56) References Cited

U.S. PATENT DOCUMENTS 5,862,089 A   1/1999  Raad et al.
5,999,439 A  12/1999  Seyyedy
(Continued)

FOREIGN PATENT DOCUMENTS

CN   103971741 A   8/2014

OTHER PUBLICATIONS

IPO, "Office Action," issued in connection with ROC (Taiwan) Application No. 107104077, dated Jan. 9,2019 (16 pages).
(Continued)

*Primary Examiner* — Mohammed A Bashar
(74) *Attorney, Agent, or Firm* — Holland & Hart LLP

(57) ABSTRACT

Methods, systems, and devices for operating a memory cell or memory cells are described. Cells of a memory array may be pre-written, which may include writing the cells to one state while a sense component is isolated from digit lines of the array. Read or write operations may be executed at the sense component while the sense component is isolated, and the cell may be de-isolated (e.g., connected to the digit lines) when write operations are completed. The techniques may include techniques accessing a memory cell of a memory array, isolating a sense amplifier from a digit line of the memory array based at least in part on the accessing of the cell, firing the sense amplifier, and pre-writing the memory cell of the memory array to a second data state while the sense amplifier is isolated. In some examples, the memory cell may include a ferroelectric memory cell.

20 Claims, 9 Drawing Sheets

Related U.S. Application Data continuation of application No. 15/426,871, filed on Feb. 7, 2017, now Pat. No. 10,418,084.

(52) U.S. Cl.
CPC .......... *G06F 3/0689* (2013.01); *G11C 11/221* (2013.01); *G11C 11/2255* (2013.01); *G11C 11/2257* (2013.01); *G11C 11/2273* (2013.01)

(56) References Cited

U.S. PATENT DOCUMENTS

| | | | |
|---|---|---|---|
| 6,097,624 | A | 8/2000 | Chung et al. |
| 7,212,427 | B2 | 5/2007 | Ho |
| 7,616,514 | B2 | 11/2009 | Lee et al. |
| 7,684,272 | B2 | 3/2010 | Matsubara |
| 9,047,969 | B2 | 6/2015 | Alam et al. |
| 9,117,535 | B2 | 8/2015 | Madan et al. |
| 9,514,814 | B1 | 12/2016 | Sandhu et al. |
| 2004/0105296 | A1 | 6/2004 | Ho |
| 2006/0077740 | A1 | 4/2006 | Lee et al. |
| 2006/0181917 | A1* | 8/2006 | Kang ............... G11C 7/065 365/149 |
| 2014/0247642 | A1 | 9/2014 | Madhan et al. |

OTHER PUBLICATIONS

ISA/KR, International Search Report and Written Opinion of the International Searching Authority, Int'l Appl. No. PCT/US2018/016048, dated May 29, 2018, Korean Intellectual Property Office, Seo-gu, Daejeon, Republic of Korea, 12 pgs.

China National Intellectual Property Administration, "First Office Action," issued in connection with Chinese Patent Application No. 201880010412.X, dated Feb. 26, 2020 (10 pages).

* cited by examiner

PRE-WRITING MEMORY CELLS OF AN ARRAY

CROSS REFERENCE

The present application for patent is a continuation of U.S. patent application Ser. No. 16/109,339, by Derner et al., entitled "Pre-Writing Memory Cells Of An Array," filed Aug. 22, 2018, which is a continuation of U.S. patent application Ser. No. 15/426,871, by Derner et al., entitled "Pre-Writing Memory Cells Of An Array," filed Feb. 7, 2017, assigned to the assignee hereof, and each of which is expressly incorporated by reference in its entirety herein.

BACKGROUND

The following relates generally to memory devices and more specifically to pre-writing at least one memory cell to a logic state during a period when a sense component is isolated.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In some examples, memory devices may store multiple states, e.g., more than two states may be stored. To access stored information in a memory device, the electronic device may read or sense, a stored state associated with the memory device. Alternatively, to store information, the electronic device may write or program a state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory (e.g., flash memory) can store data for extended periods of time even in the absence of an external power source. Volatile memory devices (e.g., DRAM) may lose their stored state over time unless they are periodically refreshed by an external power source. A binary memory device may, for example, include a charged or discharged capacitor. A charged capacitor may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous.

FeRAM may use device architectures similar to those of volatile memory, but may have non-volatile properties due to the use of a ferroelectric capacitor as a storage device. FeRAM devices may thus have improved performance compared to other non-volatile and volatile electronic memory apparatuses. Writing a ferroelectric memory cell, including performing multiple sequential write operations, however, may be a relatively time-consuming process, which may affect latency or other operational characteristics of an array.

BRIEF DESCRIPTION OF THE DRAWINGS

Embodiments of the disclosure are described with reference to the following figures.

DETAILED DESCRIPTION

Figure 1:
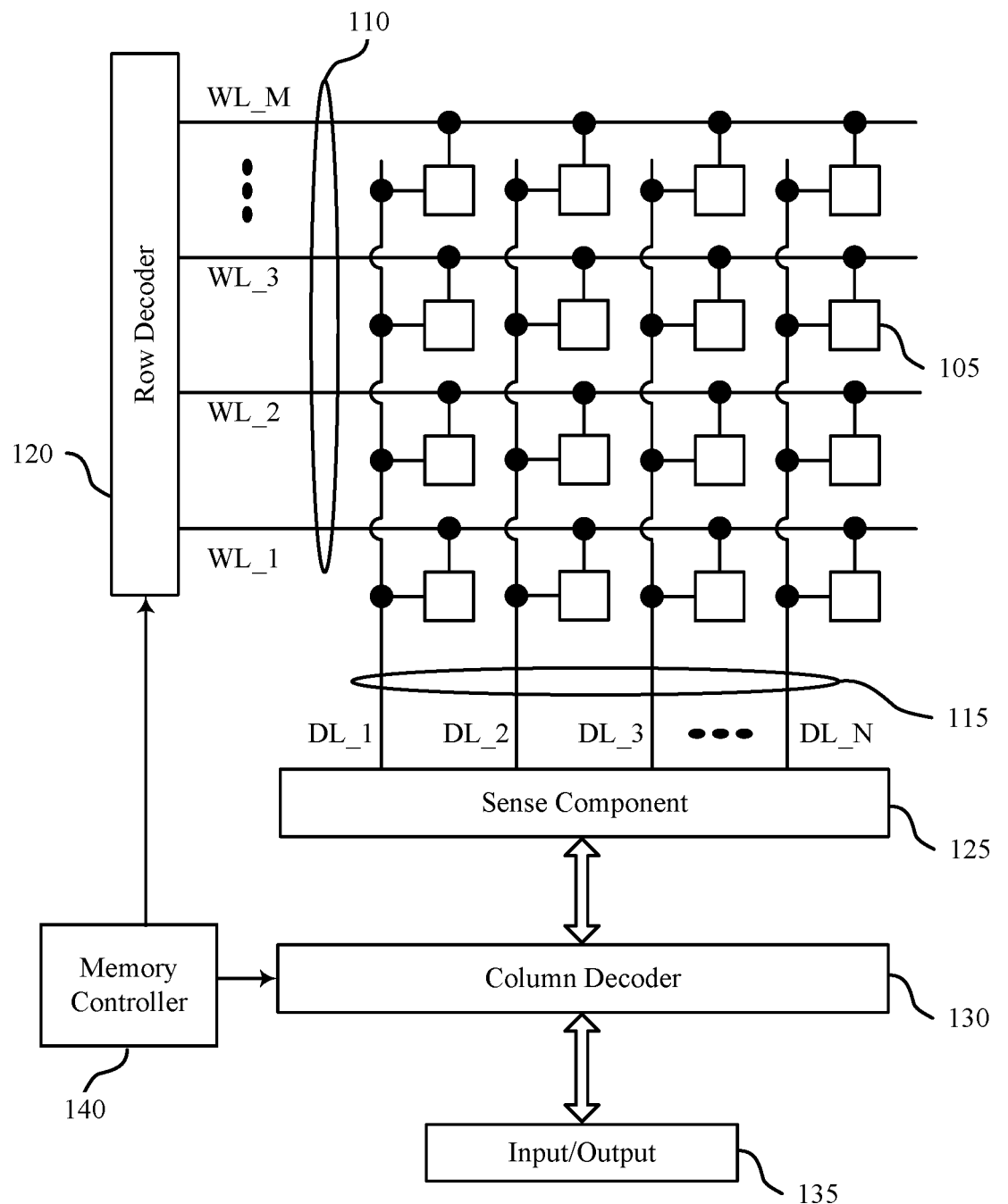
FIG. 1 illustrates an example electronic memory apparatus, in accordance with various embodiments of the present disclosure.

Memory cells may be pre-written to reduce (or "hide," at least in part) the time delay observed when writing a cell. For example, during a sensing operation, the data state stored in the cell may be restored or written back after the cell is read. While the cell is being written, it may be unusable or otherwise inaccessible. The time that the cell is being written may also affect the speed with which other operations may be performed over the array. The effective time for writing the cell may, however, be reduced by isolating the digit line nodes of a sense amplifier away from the main array digit lines using ISO devices. That is, the time during which the cell is unusable or inaccessible may be reduced by pre-writing the cell while other operations are on-going.

Techniques, methods, and apparatuses for pre-writing memory cells, for example, memory cells of an array are described herein. In the present disclosure, the memory cells may include ferroelectric memory cells, but are not limited to ferroelectric memory cells and other types of memory cells and arrays may be used and are contemplated. The active page main array cells may be pre-written to a single data state during the sense amplifier isolation period. This pre-writing may essentially "hide" (i.e., limit the effect of) at least part of the time used to write to a state. When the array digit lines are de-isolated from the sense component digit lines, the array is written.

In some examples, a method may include sensing a first logic state stored in a memory cell of a memory array with a sense component that is coupled to the memory cell via a digit line, isolating the sense component from the digit line of the memory array based at least in part on sensing the first logic state, and pre-writing at least one of a plurality of memory cells of the memory array to a second logic state while the sense component is isolated, wherein the plurality of memory cells includes the memory cell.

In some examples, pre-writing at least one of the plurality of memory cells may include decreasing a voltage of a plurality of digit lines of the memory array to ground while the sense component is isolated, wherein the plurality of digit lines includes the digit line, and writing the plurality of memory cells of the memory array to the second logic state based at least in part on decreasing the voltage of the plurality of digit lines of the memory array to ground. In some examples, the value of the second logic state may be based at least in part on a voltage of a plate line coupled to the memory cell. In some cases, decreasing the voltage of the plurality of digit lines of the memory array to ground may include activating an equalization device coupled to one of the plurality of digit lines.

In some examples, the method may include performing one or more read or write operations at the sense component while the sense component is isolated. In some examples, the method may include deisolating the sense component based at least in part on pre-writing the plurality of memory cells. In some cases, the memory may further include writing the memory cell of the memory array to the first logic state based at least in part on deisolating the sense component. In some cases, the first logic state may be equivalent to the second logic state. In some cases, the first logic state may be different from the second logic state.

In some examples, a method includes increasing a voltage of a plate line coupled with a memory cell, activating an access line coupled to the memory cell, wherein a voltage of a digit line coupled between the memory cell and a sense component increases base at least in part on activating the access line, increasing the voltage of the plate line, and a first logic state stored in the memory cell, isolating the sense component from the digit line based at least in part on increasing the voltage of the digit line, and writing the memory cell to a second logic state based at least in part on isolating the sense component.

In some examples, the method may further include activating the access line after the voltage of the plate line satisfies a threshold. In some examples, writing the memory cell to the second logic state comprises writing the memory cell using an equalization device while the sense component is isolated.

In some examples, the method may further include reading or writing at the sense component one or more times while the sense component is isolated from the memory cell. In some examples, the method may include decreasing the voltage of the digit line to ground based at least in part on isolating the sense component from the digit line. In one example, the method includes decreasing the voltage of the plate line based at least in part on decreasing the voltage of the digit line to ground. In some cases, the voltage of the plate line may be decreased based at least in part on a voltage at a bottom node of the memory cell decreasing to ground. In some cases, the plate line may be coupled to a first terminal of the memory cell and the bottom node may include a second terminal of the memory cell.

In some examples, the method may include reading or writing at the sense component one or more times after decreasing the voltage of the plate line and while the sense component is isolated from the memory cell, and deisolating the sense component after reading or writing at the sense component one or more times. In some cases, the method may include writing the memory cell to the first logic state based at least in part on deisolating the sense component.

An electronic memory apparatus may include a memory array comprising a plurality of memory cells, a sense component in electronic communication with a memory cell of the plurality of memory cells via a digit line, and a controller in electronic communication with the memory array and the sense component, where the controller may be operable to access the memory cell to sense a stored logic state, isolate the sense component from the digit line of the memory array based at least in part on accessing the memory cell, and pre-write the plurality of memory cells of the memory array while the sense component is isolated. In some cases, the controller may deisolate the sense component based at least in part on pre-writing the plurality of memory cells, and write the memory cell to a logic state that is based at least in part on pre-writing the memory cell.

Examples introduced above are further described below in the context of an electronic memory apparatus. Specific examples of techniques that support pre-writing are then described. These and other embodiments of the disclosure are further illustrated by and described with reference to apparatus diagrams, system diagrams, and flowcharts.

FIG. 1 illustrates an example electronic memory apparatus 100, in accordance with various embodiments of the present disclosure. Electronic memory apparatus 100 may also be, be referred to as, or include a memory array. The electronic memory apparatus 100 may include a plurality of memory cells 105 that are programmable to store different states. In some examples, each memory cell 105 may be programmable to store two logic states, denoted a logic "0" and a logic "1." In other examples, a memory cell 105 may be configured to store more than two logic states. A memory cell 105 may include a capacitor to store a charge representative of the programmable states; for example, a charged and uncharged capacitor may represent two logic states. DRAM architectures may commonly use such a design, and the capacitor employed may include a dielectric material with linear electric polarization properties. By contrast, a FeRAM cell may include a capacitor that has a ferroelectric material as the dielectric material, where ferroelectric materials have non-linear polarization properties.

Operations such as reading or writing may be performed on the memory cells 105 by activating or selecting an appropriate word line 110 and digit line 115. In some cases, a word line 110 may be referred to as an access line, and a digit line 115 may be referred to as a bit line. Activating or selecting a word line 110 or a digit line 115 may include applying a voltage potential (e.g., a high level voltage or a low level voltage) to the respective line. The word lines 110 and digit lines 115 may be made of conductive materials. For example, the word lines 110 and digit lines 115 may be made of metals (e.g., copper, aluminum, gold, tungsten), metal alloys, other conductive materials, or the like. Each row of memory cells 105 may be connected to a single word line 110, and each column of memory cells 105 may be connected to a single digit line 115. By activating or selecting one word line 110 and one digit line 115, a single memory cell 105 coupled to the word line 110 and digit line 115 may be accessed. Identifiers of the word line 110 and digit line 115 associated with a memory cell 105 may be referred to as an address of the memory cell 105 (though in some cases, an address of a memory cell 105 may further include one or more of a memory block identifier, a memory bank identifier, etc.).

In some architectures, the logic storing device of a memory cell 105, e.g., a capacitor, may be electrically isolated from a digit line 115 associated with the memory cell 105 by a selection component. The word line 110 associated with the memory cell 105 may be connected to and may control the selection component. In some examples, the selection component may include a transistor. Additionally or alternatively, word line 110 may be connected to the gate of the transistor of the selection component. In some cases, activating the word line 110 may result in an electrical connection between one electrode of the capacitor of the memory cell 105 and the digit line 115 associated with the memory cell 105. As a result, the digit line 115 may be accessed to perform an operation (e.g., a read operation) on memory cell 105. Alternatively, the digit line 115 may be accessed to perform an operation (e.g., a write operation) on memory cell 105.

In some examples, accessing memory cells 105 may be controlled through a row decoder 120 and a column decoder 130. For example, a row decoder 120 may receive a row address from memory controller 140 and activate an appropriate word line 110 based on the received row address. Similarly, a column decoder 130 may receive a column address from the memory controller 140 and activate or select an appropriate digit line 115. In other words, by activating or selecting a word line 110 and a digit line 115, a memory cell 105 may be accessed. Additionally or alternatively, electronic memory apparatus 100 may include multiple word lines 110, labeled WL_1 through WL_M, and multiple digit lines 115, labeled DL_1 through DL_N, where M and N depend on a memory array size. By activating a word line 110 and a digit line 115, e.g., WL_2 and DL_3, memory cell 105 coupled to the word line 110 (e.g., WL_2) and digit line 115 (e.g., DL_3) may be accessed. In some examples, memory cells 105 associated with a word line 110 may be accessed by activating or selecting all of the digit lines 115 associated with the memory cells 105.

A memory cell 105 may be read, or sensed, by a sense component 125 to determine a logic state stored in memory cell 105. For example, after accessing (e.g., addressing) a FeRAM cell, a ferroelectric capacitor of the FeRAM cell may discharge onto a corresponding digit line 115. As another example, after accessing memory cell 105, the ferroelectric capacitor of memory cell 105 may discharge a second charge (e.g., a polarization charge) onto a corresponding digit line 115. Discharging the ferroelectric capacitor may be based on biasing, or applying a voltage to, the ferroelectric capacitor. The discharging may induce a change in the voltage of the digit line 115, which the sense component 125 may compare to a reference voltage (not shown) in order to determine the logic state stored in the memory cell 105. For example, when a voltage of digit line 115 is higher than the reference voltage, the sense component 125 may determine that the logic state stored in the memory cell is a logic "1," and when a voltage of digit line 115 is lower than the reference voltage, the sense component 125 may determine that the logic state stored in the memory cell is a logic "0." In some examples, the sense component 125 may include various transistors or amplifiers (e.g., sense amplifiers) used to amplify and sense a voltage differences between one or more of the digit lines 115 and a reference voltage. In some examples, the sense component 125 may latch the voltage difference(s). The sensed logic state of one or more memory cells 105 may then be output through the column decoder 130 as output 135.

A memory cell 105 may be set or written, by activating a word line 110 and digit line 115. As discussed above, activating a word line 110 electrically connects a corresponding row of memory cells 105 to their respective digit lines 115. By controlling the digit line 115 while the word line 110 is activated, a memory cell 105 may be written— i.e., a state may be stored in the memory cell 105. Column decoder 130 may accept data, for example input 135, to be written to the memory cells 105. A ferroelectric memory cell 105 may be written by applying a voltage across the ferroelectric capacitor. This process is discussed in more detail in the present disclosure. For example, voltages and other may characteristics may change over time for a variety of cell elements, such as the digit lines, word line, isolation ("ISO") devices or components, equalizer ("EQ") devices or components, control signals or selection devices or components (e.g., "CSELs"), and the like, resulting in pre-writing at least one memory cell to a logic state during a period when a sense component is isolated.

In one embodiment, when the digit line nodes of a sense component are isolated away from main array digit lines using ISO devices, the active page main array cells may be pre-written to a single data state during the isolation period. In addition, during the isolation period, other read and/or write operations may be enabled, due to the fact that read and/or write operations flip the node digit lines of the sense component. After the pre-write to the single data state finishes, the cell plate may then be flipped to the opposite polarity, and any sense component data that is opposite of the pre-written array may be restored.

In some memory architectures, accessing a memory cell 105 may degrade or destroy a logic state stored in memory cell 105. As a result, a rewrite or a refresh operation may be performed associated with memory cell 105 to rewrite the logic state to memory cell 105. In a DRAM, for example, a capacitor may be partially or completely discharged during a sense operation, corrupting the stored logic state. In some examples, the logic state may be re-written after the sense operation. Additionally, activating a single word line 110 may result in the discharge of all memory cells in the row; as a result, all memory cells 105 in the row may be read and re-written.

Some memory architectures, including DRAM architectures, may prevent losing a stored state over time based on being periodically refreshed by an external power source. For example, a charged capacitor may become discharged over time through leakage currents, resulting in the loss of a stored logic state. The refresh rate of these so-called volatile electronic memory apparatuses may be relatively high, e.g., tens of refresh operations per second for DRAM, which may result in significant power consumption. With increasingly larger memory arrays, increased power consumption may inhibit the deployment or operation of memory arrays (e.g., power supplies, heat generation, material limits), especially for mobile devices that rely on a finite power source, such as a battery. As discussed below, ferroelectric memory cells may have beneficial properties that may result in improved performance relative to other memory architectures.

The memory controller 140, in some examples, may control the operation (read, write, rewrite, refresh, etc.) of memory cells 105 through various components, for example, row decoder 120, column decoder 130, and sense component 125. The memory controller 140 may generate row and column address signals in order to activate a desired word line 110 and digit line(s) 115. The memory controller 140 may also generate and control various voltage potentials used during the operation of the electronic memory apparatus 100. For example, memory controller 140 may control cell plate voltages of memory cells 105. In some examples, an amplitude, shape, or duration of an applied voltage described herein may be adjusted or varied and may be different for various operations employed in operating the electronic memory apparatus 100. Furthermore, one, multiple, or all of the memory cells 105 in electronic memory apparatus 100 may be accessed simultaneously; for example, multiple or all memory cells 105 of the electronic memory apparatus 100 may be accessed simultaneously during a reset operation, in which all of the memory cells 105, or a group of the memory cells 105, are set to a single logic state.

Figure 2:
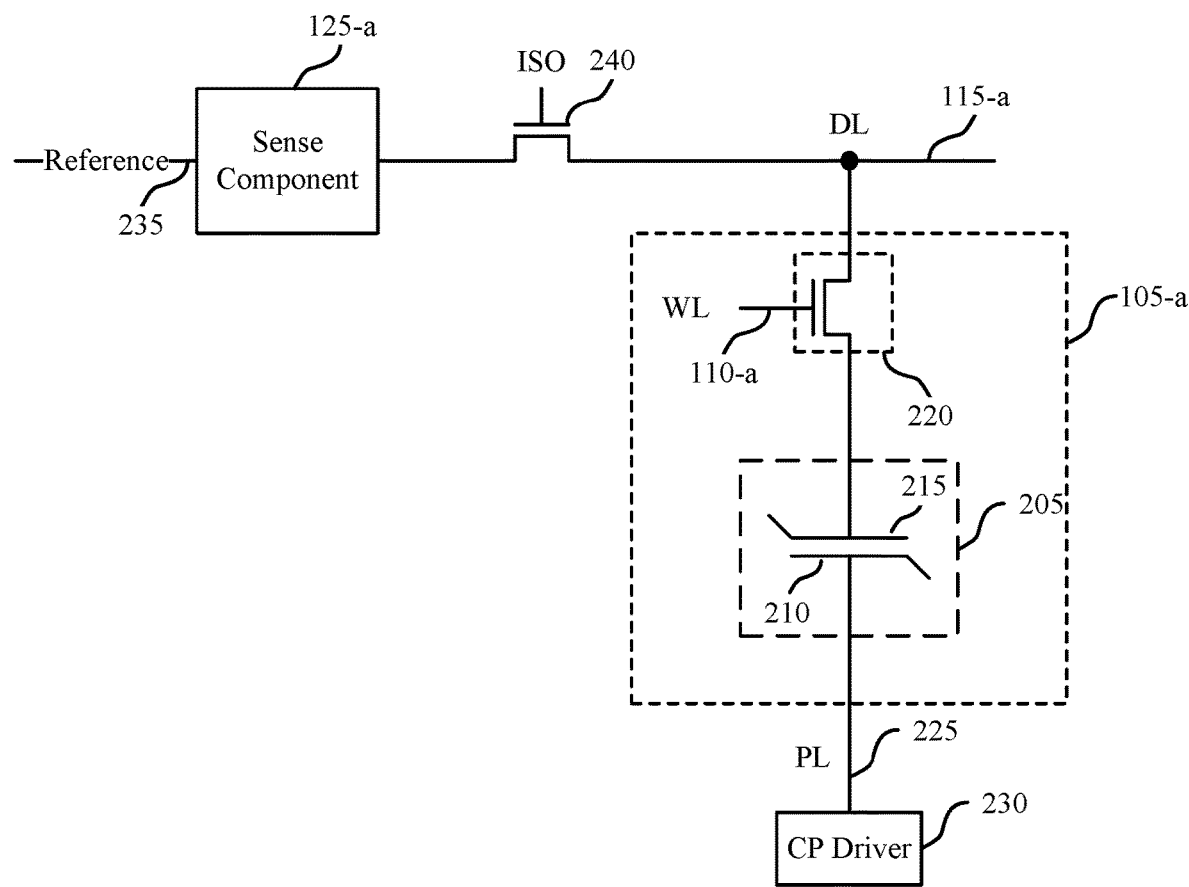
FIG. 2 illustrates an example electronic memory apparatus, in accordance with various embodiments of the present disclosure.

FIG. 2 illustrates an example circuit 200 in accordance with various embodiments of the present disclosure. The circuit 200 may include a memory cell 105-*a* (e.g., ferroelectric memory cell) associated with a word line 110-*a*, a digit line 115-*a*, and a sense component 125-*a*, which may be examples of the memory cell 105, word line 110, digit line 115, and sense component 125, respectively, described with reference to FIG. 1. The memory cell 105-*a* may include a logic storage component, such as capacitor 205 having two conductive electrodes, a cell bottom 215, and a cell plate 210. The cell bottom 215 and cell plate 210 may be capacitively coupled through a ferroelectric material positioned between cell bottom 215 and cell plate 210. In some examples, the orientation of cell bottom 215 and cell bottom 215 may be flipped without changing the operation of memory cell 105-*a*.

As described above, various states may be stored by charging or discharging the capacitor 205. In some examples, capacitor 205 may be a ferroelectric capacitor. Circuit 200 may also include a selection component 220 coupling the cell bottom 215 to the digit line 115-*a*. A plate line (PL) 225 may be coupled to cell plate 210 of the capacitor 205. As a result, capacitor 205 may be accessed, controlled, read, or written by means of voltages applied to the digit line 115-*a* and the plate line 225.

The stored state of the capacitor 205 may be read or sensed by operating various elements of the circuit 200. The capacitor 205 may be isolated from the digit line 115-*a* when the selection component 220 is deactivated (e.g., when the word line 110-*a* is not asserted), and the capacitor 205 may be coupled to the digit line 115-*a*, via the selection component 220, when the selection component 220 is activated (e.g., when the word line 110-*a* is asserted). In some cases, the selection component 220 may include a transistor (e.g., an NMOS transistor) having a source coupled to the cell bottom 215 of the capacitor 205, a drain coupled to the digit line 115-*a*, and a gate driven by the word line 110-*a*. In an alternative embodiment, the positions of the selection component 220 and the capacitor 205 may be switched, such that the selection component 220 is coupled to and between the plate line 225 and the cell bottom 215, and such that the capacitor 205 is coupled to and between the digit line 115-*a* and the selection component 220. This configuration may be associated with alternative timing and biasing for read and/or write operations.

In an operation of memory cell 105-*a*, a fixed or constant voltage may be applied to cell bottom 215 using plate line 225. In some cases, the fixed voltage may be half of the voltage supplied to sense component 125-*a*. In other words, the voltage applied to plate line 225 may remain at a fixed voltage. This operation may be referred to as "fixed cell plate." In order to read memory cell 105-*a*, digit line 115-*a* may be virtually grounded and subsequently isolated from virtual ground before applying a voltage to word line 110-*a*. In some examples, selecting memory cell 105-*a* may result in a voltage difference across capacitor 205, because plate line 225 is held at a voltage and digit line 115-*a* was virtually grounded. As a result, the voltage of digit line 115-*a* may change. In some cases, this induced voltage may be compared at sense component 125-*a* with a reference voltage.

In some examples, due to the ferroelectric material between the electrodes of the capacitor 205, and as discussed in more detail below, the capacitor 205 may not discharge upon connection to the digit line 115-*a*. In one scheme, to sense the logic state stored by the capacitor 205, the word line 110-*a* may be asserted to select the memory cell 105-*a* and a voltage may be applied (e.g., by a cell plate (CP) driver 230) to the plate line 225. In some cases, the digit line 115-*a* may be virtually grounded and then isolated from the virtual ground (i.e., "floating") before asserting the word line 110-*a* and biasing the plate line 225. Biasing the plate line 225 may result in a voltage difference (e.g., plate line voltage minus digit line voltage) across the capacitor 205. The voltage difference may yield a change in the stored charge on the capacitor 205, where the magnitude of the change in the stored charge may depend on the initial logic state of the capacitor 205—e.g., whether the initial logic state is a logic "1" or a logic "0." This may induce a change in the voltage of the digit line 115-*a* based on the charge stored on capacitor 205. In one operation of the memory cell 105-*a*, varying the voltage applied to the plate line 225 may be referred to as "moving cell plate."

In some examples of operation of the memory cell 105-*a*, a fixed or constant voltage may be applied to the plate line 225 (e.g., the fixed voltage may be half of the voltage supplied to sense component 125-*a*). That is, the voltage applied to plate line 225 may remain at a fixed voltage and may not be varied as described above. This operation may be referred to as "fixed cell plate" operation. In order to read the memory cell 105-*a* using fixed cell plate operation, the digit line 115-*a* may be virtually grounded, and isolated from the virtual ground, before activating the word line 110-*a*. As described above, selecting the memory cell 105-*a* may result in a voltage difference across the capacitor 205, because plate line 225 is held at a voltage and the digit line 115-*a* was virtually grounded. As a result, the voltage of the digit line 115-*a* may change, e.g., become some finite value.

Regardless of whether the memory cell 105-*a* is read according to moving cell plate operation, fixed cell plate operation, some combination, or some other method of operation, the change in the voltage of the digit line 115-*a* may depend on the intrinsic capacitance of the digit line 115-*a*—i.e., as charge flows through the digit line 115-*a*, some finite charge may be stored in digit line 115-*a* and the resulting voltage of the digit line 115-*a* may depend on the intrinsic capacitance. In some examples, the intrinsic capacitance may depend on physical characteristics, including the dimensions, of the digit line 115-*a*. In some examples, the digit line 115-*a* may connect memory cells 105 to digit line 115-*a*, so that the digit line 115-*a* may have a length that results in a non-negligible capacitance (e.g., on the order of pico-farads (pF)). The resulting voltage of the digit line 115-*a* may then be compared to a reference voltage (e.g., a voltage of reference line 235), by the sense component 125-*a*, in order to determine the stored logic state in memory cell 105-*a*.

The sense component 125-*a* may include various transistors or amplifiers (e.g., a sense amplifier) to amplify and sense a voltage difference between the voltage of the digit line 115-*a* and a voltage of the reference line 235. In some examples, the sense component 125-*a* may latch the voltage difference. In some examples, an output of the sense component 125-*a* may be driven to a high (e.g., a positive) supply voltage or to a low (e.g., a negative or ground) supply voltage based on the comparison. For instance, when digit line 115-*a* has a higher voltage than the reference line 235, the sense component 125-*a* output may be driven to a positive supply voltage. In some cases, the sense component 125-*a* may drive the digit line 115-*a* to the positive supply voltage while performing a sensing operation. In other cases, the digit line 115-*a* may be decoupled from the sense component 125-*a* by a transfer gate 240 before performance of the sensing operation.

Alternatively, when the digit line 115-a has a lower voltage than the reference line 235 (i.e., reference voltage signal), the sense component 125-a output may be driven to a negative or ground supply voltage. In some cases, the sense component 125-a may drive the digit line 115-a to the negative or ground supply voltage while performing a sensing operation. In other cases, the digit line 115-a may be decoupled from the sense component 125-a by a transfer gate 240 before performing the sensing operation. In some examples, the transfer gate 240 may include a transistor (e.g., a NMOS transistor, a PMOS transistor) having a source coupled to the sense component 125-a, a drain coupled to the digit line 115-a, and a gate driven by an isolation signal (ISO).

In some cases, to write the memory cell 105-a according to moving cell plate operation, a voltage associated with a logic state may be applied across the capacitor 205. Various methods may be used to apply the voltage. In one example, the selection component 220 may by asserting the word line 110-a in order to electrically connect the capacitor 205 to the digit line 115-a. A voltage may be applied across the capacitor 205 by controlling the voltage of the cell plate 210 (through the plate line 225) and the cell bottom 215 (through the digit line 115-a). To write a logic "0," the cell plate driver 230 may apply a first voltage (e.g., a positive voltage, a high voltage) to the cell plate 210 through the plate line 225, and a second voltage (e.g., a negative or ground voltage, a low voltage) may be applied to the cell bottom 215 through the digit line 115-a. The opposite voltages may be applied to the electrodes of the capacitor 205 to write a logic 1 (e.g., cell plate 210 may be taken low and the cell bottom 215 may be taken high).

Regarding fixed cell plate operation, writing the memory cell 105-a may include activating the selection component 220 and biasing the cell bottom 215 through the digit line 115-a. In some cases, the fixed voltage magnitude of the cell plate 210 may be a value between the supply voltage(s) of the sense component 125-a, and the sense component 125-a may be used to drive the voltage of the digit line 115-a to a voltage equal to the high or the low supply voltage. For instance, to write a logic "0," the voltage of the digit line 115-a may be driven to the low supply voltage, to apply the low supply voltage to the cell bottom 215. Alternatively, to write a logic "1," the voltage of the digit line 115-a may be driven to the high supply voltage, to apply the high supply voltage to the cell bottom 215.

Figure 3A:
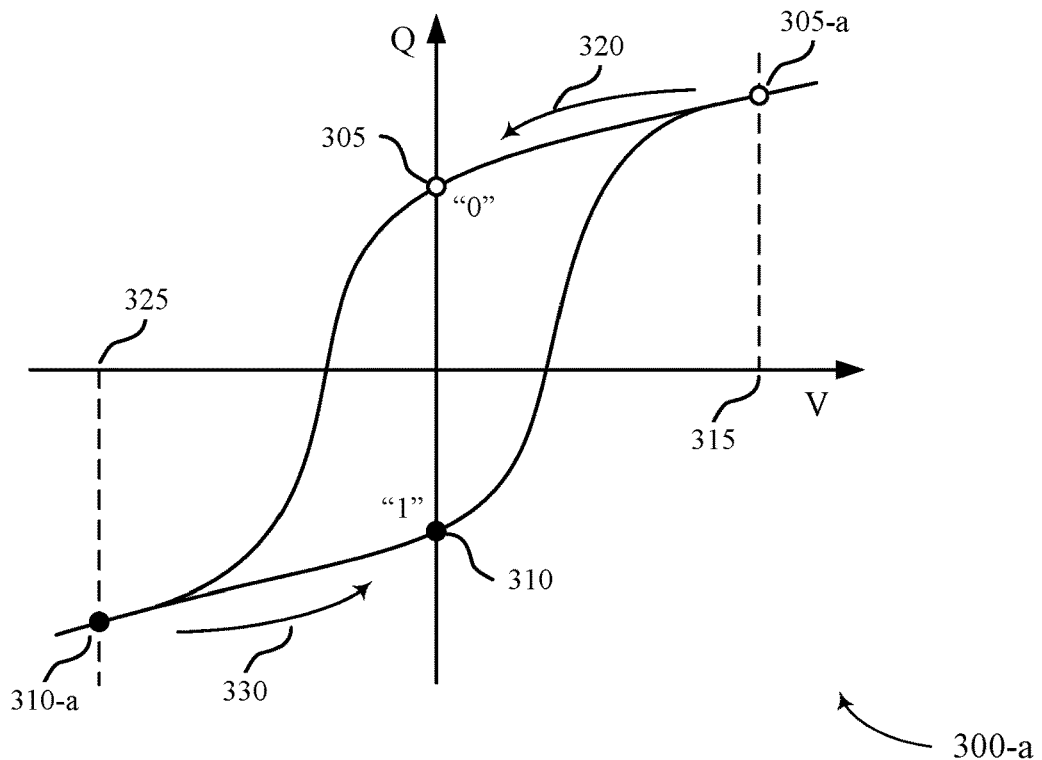
FIGS. 3A and 3B illustrate examples of non-linear electrical properties of a FeRAM cell, in accordance with various embodiments of the present disclosure.
Figure 3B:
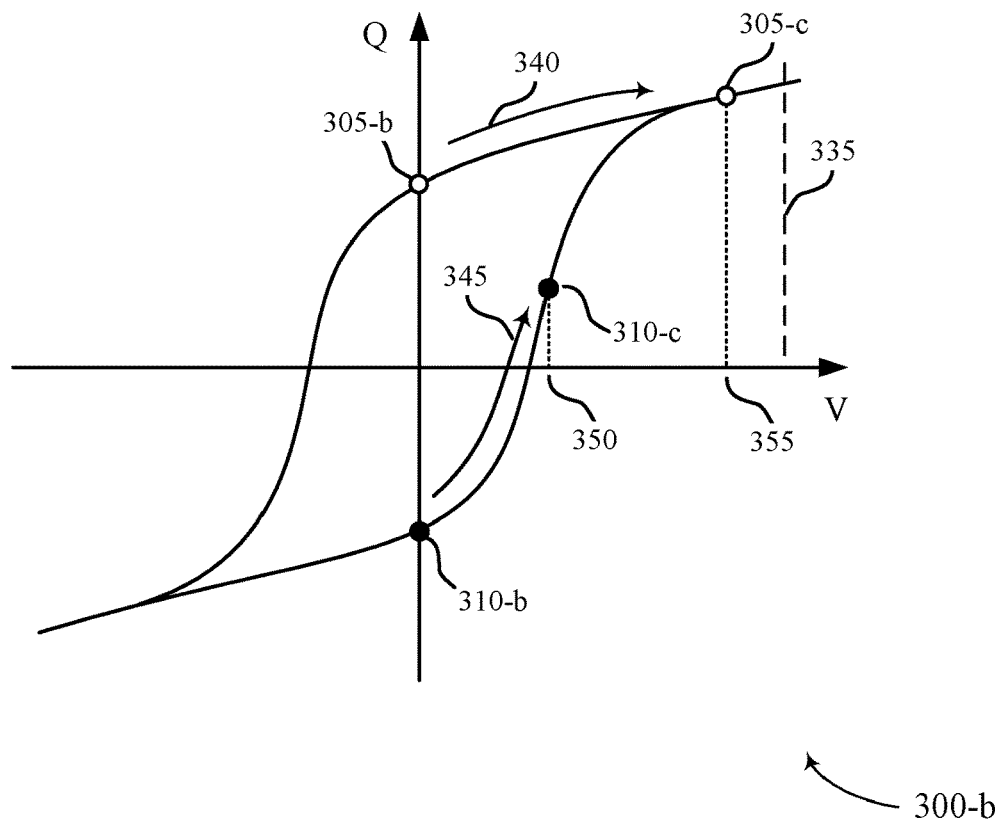

FIGS. 3A and 3B illustrate examples of non-linear electrical properties of a ferroelectric memory cell, in accordance with various embodiments of the present disclosure. Hysteresis curves 300-a and 300-b illustrate an example ferroelectric memory cell writing and reading process, respectively. Each of the hysteresis curves 300 depict the charge, Q, stored on a ferroelectric capacitor of the ferroelectric memory cell as a function of a voltage difference, V. The ferroelectric memory cell may be an example of embodiments of memory cell 105 or ferroelectric memory cell 105-a described with reference to FIG. 1 or 2, and the ferroelectric capacitor may be an example of the capacitor 205 described with reference to FIG. 2.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300 may be understood from the perspective of a single electrode of a capacitor. By way of example, if the ferroelectric material has a negative polarization, positive charge accumulates at the electrode. Alternatively, if the ferroelectric material has a positive polarization, negative charge accumulates at the electrode. Additionally, it should be understood that the voltage differences in the hysteresis curves 300 represent voltage differences across a ferroelectric capacitor and are directional. For example, a positive voltage may be realized by applying a positive voltage to the electrode in question (e.g., the cell plate 210 described with reference to FIG. 2) and maintaining the second electrode (e.g., the cell bottom 215 described with reference to FIG. 2) at ground (or approximately zero volts (0V)). A negative voltage may be applied by maintaining the electrode in question at ground and applying a positive voltage to the second electrode—i.e., positive voltages may be applied to negatively polarize the electrode in question. Similarly, two positive voltages, two negative voltages, or any combination of positive and negative voltages may be applied to the appropriate capacitor terminals to generate the voltage differences shown in the hysteresis curves 300.

As depicted in hysteresis curve 300-a, the ferroelectric material may maintain a positive or negative polarization with a zero voltage difference, resulting in two possible charged states: a charge state 305 and a charge state 310. According to the examples of FIGS. 3A and 3B, the charge state 305 represents a high capacitive state or logic "0," and the charge state 310 represents a low capacitive state or logic "1." In some examples, the logic values of the respective charge states may be reversed to accommodate other schemes for operating a ferroelectric memory cell.

A logic "0" or logic "1" may be written to the ferroelectric cell by controlling the electric polarization of the ferroelectric material, and thus the charge on the ferroelectric capacitor terminals, by applying a voltage across the ferroelectric capacitor. For example, applying a net positive voltage 315 across the ferroelectric capacitor results in charge accumulation until the charge state 305-a is reached. Upon removing the net positive voltage 315, the charge follows path 320 until it reaches the charge state 305 at zero voltage potential. Similarly, the charge state 310 is written by applying a net negative voltage 325, which results in the charge state 310-a. After removing the net negative voltage 325, the charge follows path 330 until it reaches the charge state 310 at zero voltage. The charge states 305-a and 310-a may be referred to as remnant polarization (Pr) values, i.e., the polarization (or charge) that remains upon removing the external bias (e.g., voltage). The coercive voltages are the voltages at which the charge (or polarization) is zero.

Turning to hysteresis curve 300-b, the stored state of the ferroelectric cell may be read, or sensed, by applying a voltage across the ferroelectric capacitor. In response, the stored charge, Q, changes, and the degree of the change depends on the initial charge state i.e., the final stored charge (Q) depends on whether the charge state 305-*b* or the charge state 310-*b* was initially stored. For example, hysteresis curve 300-*b* illustrates two possible stored charge states: charge state 305-*b* and charge state 310-*b*. In some examples, a voltage 335 may be applied across the ferroelectric capacitor as discussed with reference to FIG. 2. In other cases, a fixed voltage may be applied to the cell plate electrode of the ferroelectric capacitor. Although depicted as a positive voltage, voltage 335 may in some examples be negative. In response to application of the voltage 335, the charge may follow path 340. Alternatively, if the charge state 310-*b* was initially stored, the charge may follow path 345. The voltages associated with the final charge states after following the path 340 or 345 (e.g., the charge state 305-*c* and the charge state 310-*c*) depend on a number of factors, including the sensing scheme and circuitry.

In some cases, a final charge state may depend on the intrinsic capacitance of the digit line connected to the ferroelectric memory cell. For example, if the ferroelectric capacitor of the ferroelectric memory cell is electrically connected to the digit line and the voltage 335 is applied, the voltage of the digit line may rise due to intrinsic capacitance. So a voltage measured at a sense component may not equal the voltage 335 and instead may depend on the voltage of the digit line. The positions of the final charge states 305-*c* and 310-*c* on the hysteresis curve 300-*b* may be based on the capacitance of the digit line and may be determined through a load-line analysis—i.e., charge states 305-*c* and 310-*c* may be defined with respect to the capacitance of a corresponding digit line. As a result, the voltages across the ferroelectric capacitor at the charge state 305-*c* and the charge state 310-*c* (e.g., the voltage 350 and the voltage 355, respectively) may differ and may depend on the initial state of the ferroelectric capacitor.

By comparing the digit line voltage to a reference voltage, the initial state of the ferroelectric capacitor may be determined. The digit line voltage (DLV) may be the difference between the voltage 335 and the final voltage across the capacitor—i.e., (DLV=voltage 335−voltage 350) or (DLV=voltage 335−voltage 355). A reference voltage may be generated such that its magnitude is between the two possible voltages of the two possible digit line voltages in order to determine the stored logic state—i.e., if the digit line voltage is higher or lower than the reference voltage. For example, the reference voltage may be an average of the two quantities: (voltage 335−voltage 350) and (voltage 335−voltage 355). Upon comparison by the sense component, the sensed digit line voltage may be determined to be higher or lower than the reference voltage, and the stored logic value of the ferroelectric memory cell (i.e., a logic "0" or a logic "1") may be determined.

To read, or sense, the stored state of the ferroelectric capacitor, a voltage may be applied across the capacitor or a word line in electronic communication with the capacitor may be activated at one or more different times. In response, one or more stored charges, which may be associated with different components or elements of the capacitor, may be transferred to and received by a sense component. For example, a first charge may be read, or sensed, at a first time based on an applied voltage or an activated word line. A second charge may be read, or sensed, at a second time based on an applied voltage or an activated word line. In some examples, the second time may be before or after the first time. In other cases, the first time and the second time may be continuous or may at least partially overlap.

As discussed above, reading a memory cell that does not use a ferroelectric capacitor may degrade or destroy the stored logic state. A ferroelectric memory cell, however, may maintain the initial logic state after a read operation. For example, if charge state 305-*b* is stored, the charge may follow path 340 to the charge state 305-*c* during a read operation and, after removing the voltage 335, the charge may return to the initial charge state 305-*b* by following path 340 in the opposite direction.

Figure 4:
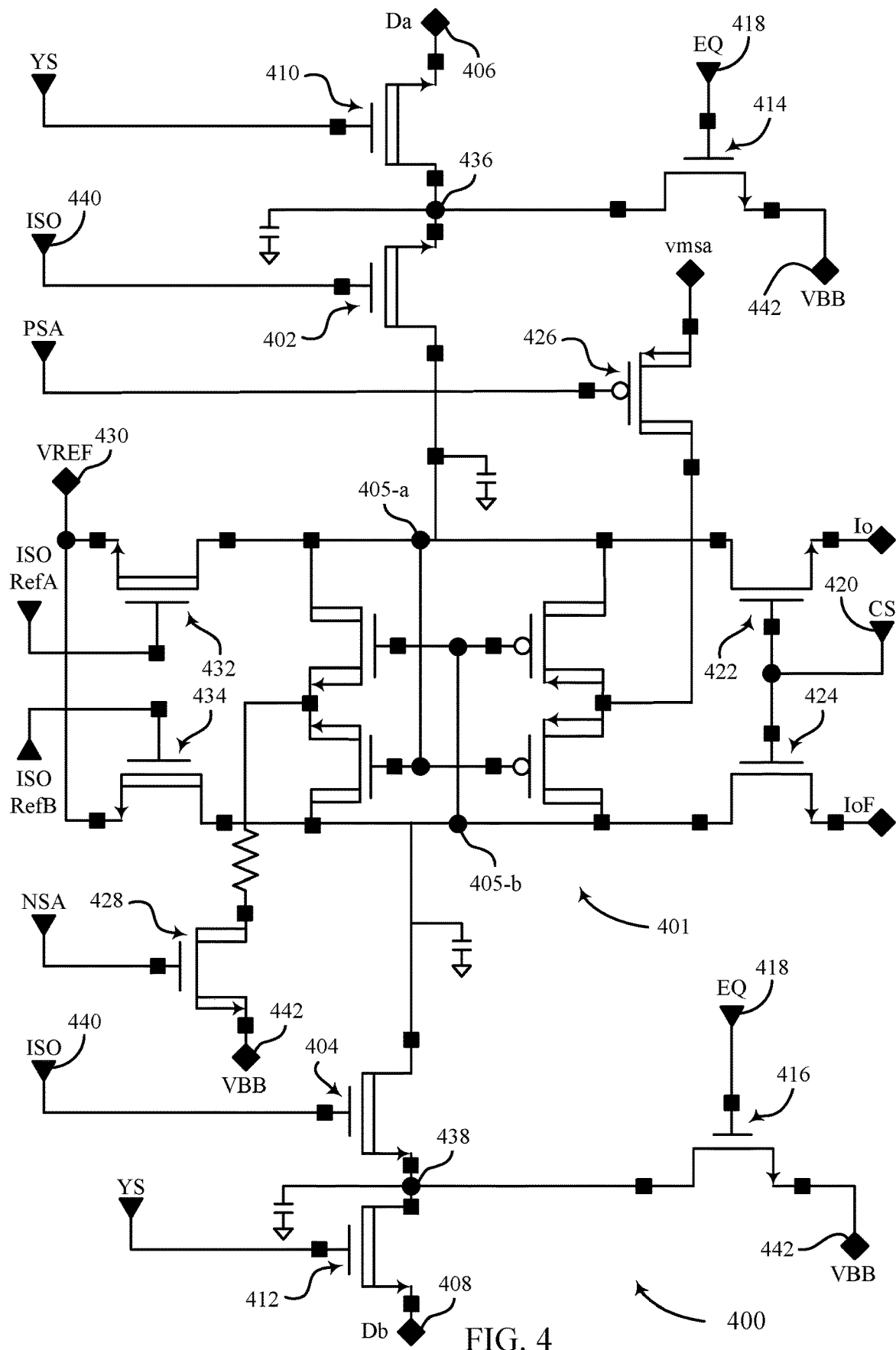
FIG. 4 illustrates an example circuit, in accordance with various embodiments of the present disclosure.

FIG. 4 illustrates an example circuit 400 that supports pre-writing memory cells of an array in accordance with various embodiments of the present disclosure. Circuit 400 may support pre-writing one or more memory cells (e.g., ferroelectric memory cells) of an array and the methods described herein are not limited to the example circuit 400. The circuit 400 may include a sense amplifier 401, which may be isolated from other components of circuit 400 by a first isolation device 402 and a second isolation device 404. The sense amplifier 401 may be coupled to one or more digit lines of memory cells at node 406 and/or node 408. In some examples, the coupled memory cells may be ferroelectric memory cells. Devices 410, 412 may represent at least a part of a digit line decoder (not shown) of the coupled memory cells. The circuit 400 may also include an equalization (EQ) device 414 and an EQ device 416 coupled to an EQ signal 418

Sense amplifier 401 may be controlled by a cell select signal 420 coupled to devices 422, 424. During an access operation, the cell select signal 420 may indicate whether data is to be read from or written to the memory cells coupled to the sense amplifier 401. Sense amplifier 401 may also include devices 426, 428 to bias the sense amplifier 401 during access operations. The sense amplifier 401 may be connected to a reference voltage 430. The reference voltage 430 may be connected to one or both of the nodes 405 of the sense amplifier 401 via the devices 432, 434. For example, the reference voltage may be connected to one of the nodes 405 when the sense amplifier 401 is used to selectively perform an access operation on one of the memory cells coupled to the sense amplifier 401.

In some examples, the sense amplifier 401 may connect to terminals of the isolation devices 402, 404 by way of nodes 405. In some cases, the nodes 405 may be may be referred to as internal nodes or "gut nodes" because they may be within the sense amplifier 401 or otherwise physically separate from the array digit line. The first isolation device 402 may be connected to the EQ device 414 via a first node 436. The second isolation device 404 may be connected to the EQ device 416 via a second node 438. The EQ devices 414, 416 may be configured to pre-write the memory cells coupled to the sense amplifier 401 while the nodes 405 are isolated from the memory cells.

In some examples, multiple sequential write operations may be performed to the same open page; for example, at least one write time of writing a single state may be hidden using various techniques, as opposed to having write times for two or more states (i.e., hiding one of the write states to "0" or to "1"). EQ devices 414 and 416 may be located outside of the isolation devices 402 and 404. The sense amplifier 401 may be isolated by changing an isolation signal 440 from a high value (e.g., a logical one) to a low value (e.g., a logical zero). The EQ signal 418 may then be turned on (e.g., made to go high) to bring the digit lines of the memory cells coupled to the sense amplifier 401 to a state. In one example, a state may be related to a voltage 442 (VBB). In some examples, the voltage 442 may be a ground or virtual ground. In another example, the known state may be different from ground. In the example where the state is high, the sensing operation does not include pre-charging the digit lines (e.g., nodes 406, 408) to ground, but rather brings array digits to $V_{CC}$. In this scenario, all of the memory cells that have an open word line may start writing back, even though sensing is occurring within the isolated sense amplifier 401.

In other embodiments, when a sensing operation occurs (e.g., FeRAM sensing), one data state may be restored by default. The restoration of the data state may depend on whether the cell plate is set to a state (e.g., a high state or a low state) after the occurrence of the sensing operation. However, if the nodes 405 of the sense amplifier 401 are isolated from the main array digit lines (e.g., nodes 406, 408) using the isolation devices 402, 404, then the active page main array cells or a subset thereof may be pre-written to a single data state during the sense amplifier isolation period.

During a period when the digit line nodes (e.g., nodes 406, 408) are isolated from the sense amplifier 401, access operations (e.g., read and/or write operations) may be performed using the sense amplifier 401. For example, the cell select signal 420 may toggle during an access operation period without affecting the memory cells coupled to the sense amplifier 401 because of the isolation devices 402, 404. As the cell select signal 420 is toggled, the devices 422, 424 may be operated. After the pre-write operation of the memory cells coupled to the sense amplifier 401, a cell plate may be toggled to the opposite polarity. When the one or more write operations are complete, then the isolation devices 402, 404 may be activated again, connecting the sense amplifier 401 to the digit lines of the memory cells connected to the sense amplifier 401 (e.g., first node 405-$a$ is connected to node 406 and second node 405-$b$ is connected to node 408). As a result, sense amplification data that is opposite of the current pre-written array state may be restored back into the memory cells of the array.

In one example, the memory cells coupled to the sense amplifier 401 may be pre-written to a low data state. In one embodiment, after a sense operation occurs, and during the time when the nodes 405 are isolated from the main array digit lines (e.g., nodes 406, 408), the EQ signal 418 may be enabled to pull the array digit lines (e.g., nodes 406, 408) to a voltage 442 (e.g., a ground state). Due to the cell plate being high, pulling the array digit lines (e.g., nodes 406, 408) to ground may force active memory cells to be written to a low data state. During the pre-write operation, read and/or write commands may be issued to the isolated sense amplifier 401.

When the one or more pre-write operations are complete, the EQ signal 418 may be disabled, and the cell plate may be taken low to prepare for the main array write operation to the opposite data state. In one embodiment, taking the isolation signal 440 high again connects the digit lines of the memory cells (e.g., nodes 406, 408) back to the nodes 405 of the sense amplifier 401, and at least some of the memory cells in the main array are written to the desired data states. In some examples, sense amplification data that is the same as the current pre-written state of the memory cell may not be transferred back into the array.

In another example, the memory cells coupled to the sense amplifier 401 may be pre-written to a high data state. In this example, the sensing scheme may be modified so that the cell plate is set low (e.g., to a first voltage) before performing the sense operation. Additional devices (e.g., similar to EQ devices 414, 416) may be coupled to the main array digit lines (e.g., nodes 406, 408) that enable the lines to be pulled high (i.e., to $V_{CC}$, to a second voltage different from the first voltage) when the sense amplifier 401 is isolated after the sense operation. These additional devices may be controlled by the EQ signal 418 and may be coupled to a voltage different from the voltage 442. Since the cell plate is set to low (e.g., a first voltage) and the main array digit lines are high (e.g., a second voltage), the active array cells are written to a high data state.

As with pre-writing to a low data state, during the pre-write operation, read and/or write commands may be issued to the isolated sense amplifier 401. After the pre-write operation completes, the devices (e.g., EQ devices 414, 416 connected to a different voltage other than voltage 442) connecting the main array digit lines to $V_{CC}$ are disabled, and the cell plate is taken high (e.g., to a second voltage) to prepare for the main array write operation to the opposite data state. Taking the isolation signal 440 back to high may connect the main array digit lines (e.g., nodes 406, 408) back to the nodes 405 of the sense amplifier 401, and then memory cells coupled to the sense amplifier 401 may be written to the desired data state.

As used herein, the term devices may refer to switching components or transistors. Upon activating a gate using a gate voltage, a device may connect a first node of the device to a second device causing current to flow. In some examples, the circuit 400 may include a bipolar junction transistor (BJT), a field effect transistor (FET), or combinations thereof.

Figure 5A:
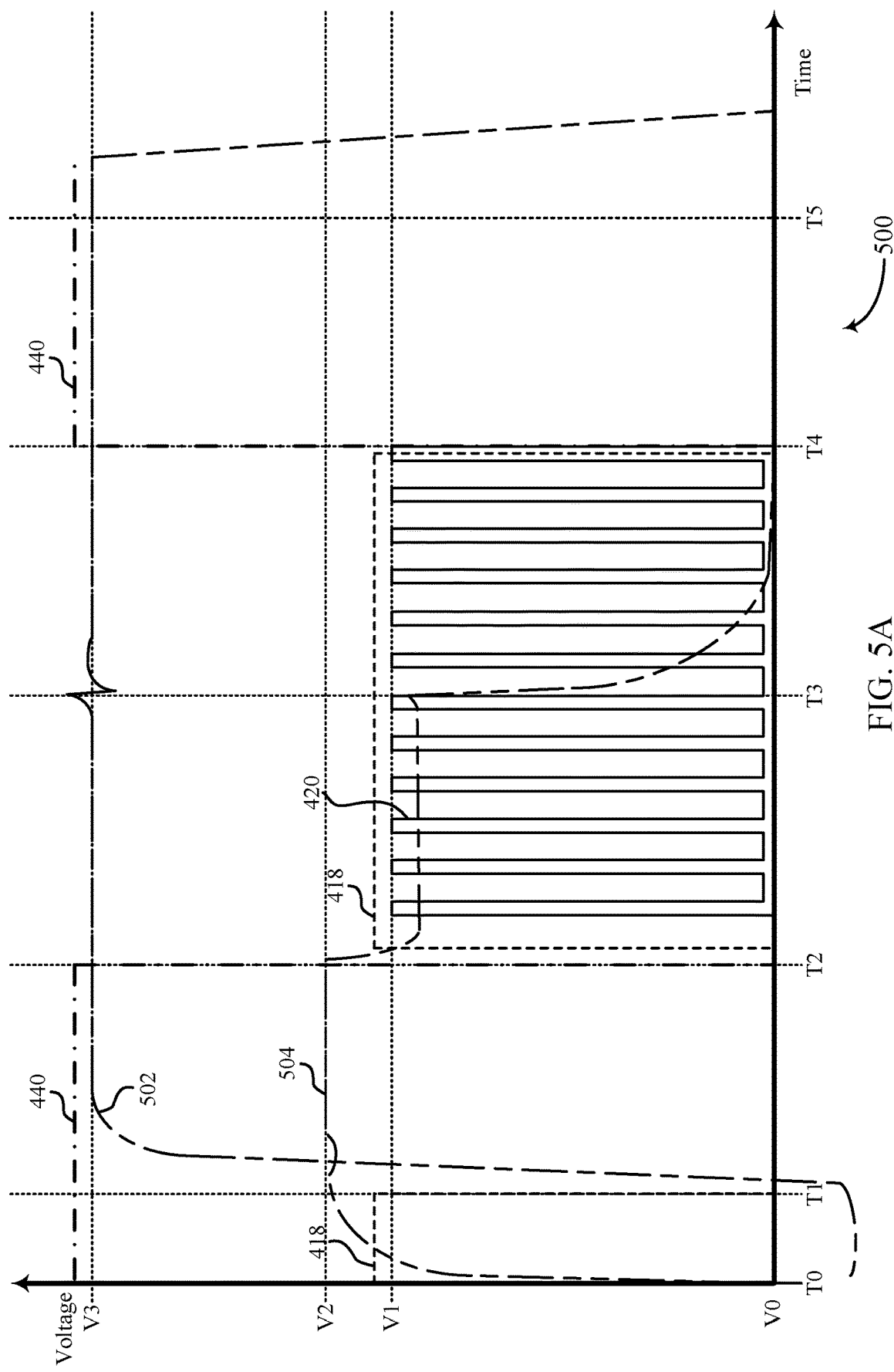
FIGS. 5A and 5B illustrate examples of a timing diagram that supports pre-writing, in accordance with various embodiments of the present disclosure.
Figure 5B:
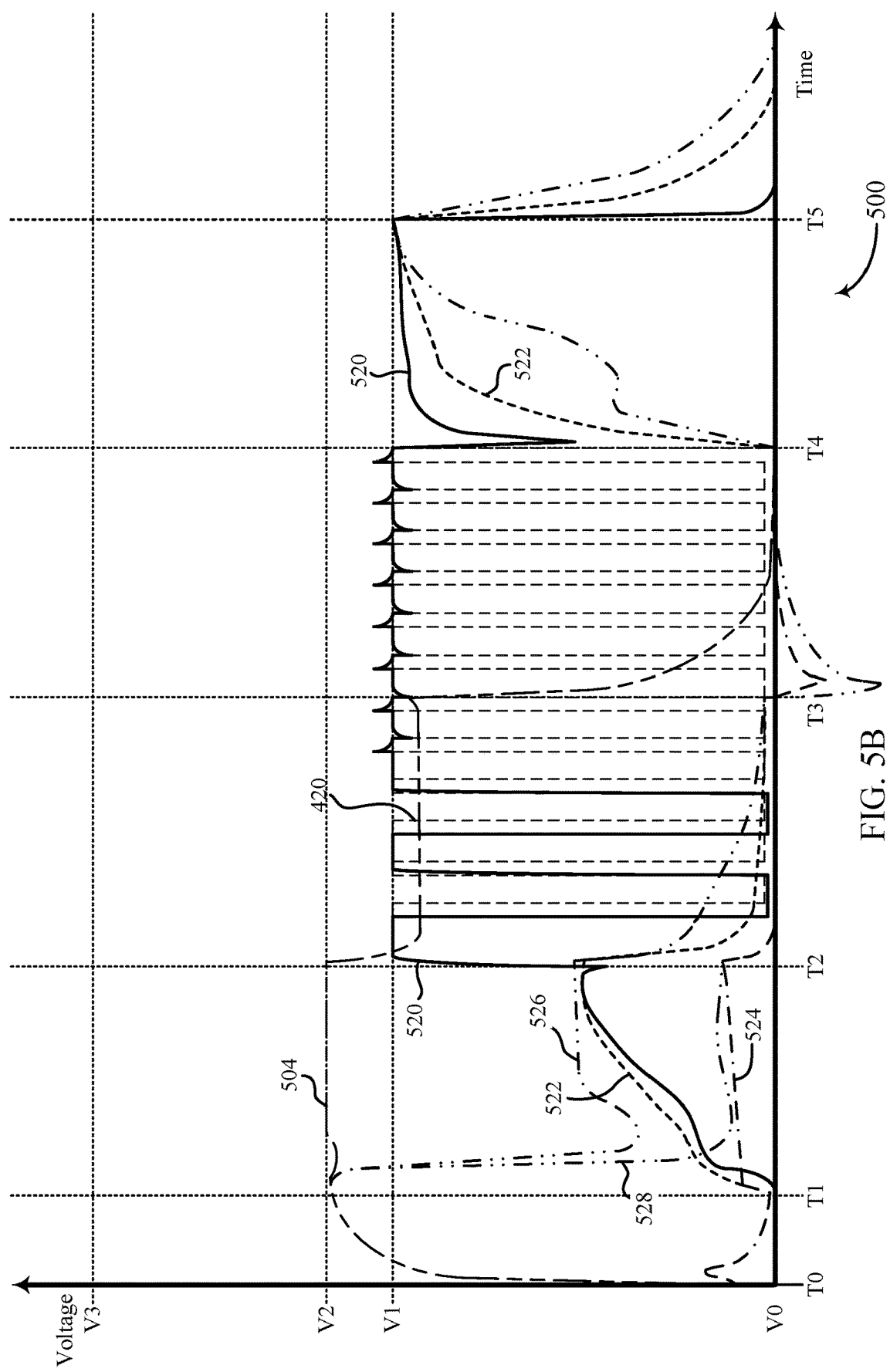

FIGS. 5A and 5B illustrate examples of timing diagram 500 that supports pre-writing memory cells of an array in accordance with various embodiments of the present disclosure. The timing diagram 500 has been split into two figures for clarity. FIG. 5A illustrates examples of some input signals related to a circuit (e.g., circuit 400). FIG. 5B illustrates examples of responses to the input signals and also illustrates some input signals.

Timing diagram 500 depicts voltage on a vertical axis and time on a horizontal axis. The operations may facilitate pre-writing to a single data state in reference to circuit 400, including sense amplifier 401, among other operations, in accordance with various embodiments of the present disclosure.

The timing diagram 500 depicts the change in voltage over time for a variety of signals. In some examples, the timing diagram 500 in FIG. 5A depicts the isolation signal 440, the EQ signal 418, the cell select signal 420, a word line signal 502, and a cell plate signal 504. In some examples, the timing diagram 500 in FIG. 5B may depict a signal 520 at one of the nodes 405, a first digit line signal 522, second digit line signal 524, a first cell bottom signal 526, and a second cell bottom signal 528. FIG. 5B also depicts the cell select signal 420 and the cell plate signal 504 to provide clarity regarding certain responses occurring. Because FIGS. 5A and 5B depict the same timing diagram and are only separated for clarity, signals depicted in either FIG. 5A or FIG. 5B may be referenced without specific reference to the figure.

In some examples, the first digit line signal 522 represents signals at nodes 406, 408 when the corresponding memory cell coupled to the sense amplifier 401 stores a logical zero. In some examples, the second digit line signal 524 represents signals at 406, 408 when the corresponding memory cell coupled to the sense amplifier 401 stores a logical one. In some examples, the first cell bottom signal 526 represents signals at a cell bottom when the corresponding memory cell coupled to the sense amplifier 401 stores a logical zero. In some examples, the second cell bottom signal 528 represents signals a cell bottom when the corresponding memory cell coupled to the sense amplifier 401 stores a logical one.

At time T0 (e.g., 0 nanoseconds), the first digit line signal 522 and second digit line signal 524 begin in a pre-charge state at a first voltage level (V0). In some examples, the first voltage level (V0) may be approximately equal to zero volts, or may be a virtual ground. In addition, the word line signal 802 may be at a second voltage level lower than the first voltage level. In addition, the cell select signal 420, the cell bottom signals 526 and 528, and the cell plate signal 504 may be at a third voltage (e.g., near or at 0V).

Between T0 and a second time T1, the cell plate signal 504 may charge to a third voltage level (V2). In some examples, the third voltage level (V2) is approximately equal to 1.8 volts. In addition, the cell bottom signals 526, 528 may also charge to be near or at the third voltage level (V2). The digit line signals 522, 524 may also go from a non-zero voltage level toward a voltage level that is near zero volts. In some examples, the third voltage level (V2) may be referred to as a higher sense amplifier voltage (i.e., $V_{MSA}$), where $V_{MSA}$ may be equal to or approximately, but is not limited to, 1.8 volts.

At time T1, the word line signal 502 may be activated such that it charges to a fourth voltage level (V3). In some examples, the fourth voltage level (V3) is approximately equal to 3.4 volts. In some examples, the time T1 is approximately equal to 10 nanoseconds. Between T1 and T2, certain signals change in voltage. For example, signals 520, 522, 526 may change to be at a fifth voltage level. In some examples, the fifth voltage level may be approximately equal to 0.85 volts. In other examples, signals 524, 528 may change to be at a sixth voltage level. In some examples, the sixth voltage level may be approximately equal to 0.3 volts. In some examples, T2 may be approximately equal to 40 nanoseconds.

In some examples, at some point before T2, the sense amplifier 401 senses a logic state stored in at least one of the memory cells coupled to the sense amplifier 401 via one or more of the nodes 406, 408. Read operations may be performed using the sense amplifier 401 while the sense amplifier 401 is isolated from nodes 406, 408 and hence isolated from one or more memory cells, including those related to an array. In some examples, the sense amplifier 401 is isolated from one or more memory cells after sensing the logic state of the memory cell.

At T2, the sense amplifier 401 may be isolated by bringing the isolation signal 440 low (e.g., to the first voltage level approximately equal to zero) from the fourth voltage level (V3). Upon isolating the sense amplifier 401, access operations (e.g., read/write operations) may be performed on the sense amplifier without disturbing the memory cells coupled to the sense amplifier 401. In FIG. 5A, the isolation signal 440 is offset from the fourth voltage level (V3) for clarity purposes only. In some examples the fourth voltage level (V3) may be referred to as a higher voltage (e.g., $V_{CC}$, 3.4 volts).

After the isolation signal 440 is changed to a low value (e.g., immediately after), the EQ signal 418 is changed from a low value (e.g., the first voltage level) to a high value (e.g., a seventh voltage level (V1) approximately equal to 1.6 volts). Bringing the EQ signal 418 high while the isolation signal 440 is low allows for a pre-write operation to be performed at a memory cell coupled to the sense amplifier 401 while other operations are being performed at the sense amplifier 401. Essentially, the circuit 400 may thus perform two operations during an overlapping period—access operations at the sense amplifier 401 and a pre-write operation at the memory cells coupled to the sense amplifier 401. In FIG. 5A, the EQ signal 418 is offset from the seventh voltage level (V1) for clarity purposes only.

At T2, after the isolation signal 440 is a low value (e.g., at the first voltage level), the cell plate signal 504 voltage decreases from the third voltage level (V2) (approximately 1.8 volts) to an eighth voltage level (approximately 1.5 volts). The cell bottom signals 526 and 528 may decrease to the first voltage level (e.g., a ground state). The digit line signals 522 and 524 may also decrease to the first voltage level (e.g., a ground state). The signals 522, 524, 526, 528 may be driven to the ground state by the EQ signal 418 causing the EQ devices 414, 416 to connect the nodes 436, 438 to a ground. In some examples, the EQ devices 414, 416 may connect the nodes 436, 438 to some other different voltage level. In those situations, the signals 522, 524, 526, 528 may be driven to that other different voltage level. The signal 520 for the nodes 405 may raise from the fifth voltage level to the seventh voltage level (V1) after the isolation signal 440 is changed to a low value.

In some examples, between time T2 and T4 (approximately 100 nanoseconds), the cell select signal 420 may toggle between the first voltage level (V0) and the seventh voltage level (V1). The cell select signal 420 may toggle as part of access operations performed on the sense amplifier 401 while the sense amplifier 401 is isolated from memory cells. The signal 520 at one of the nodes may toggle between the first voltage level (V0) and the seventh voltage level (V1). In some examples, the signal 520 may cease to toggle, even as the cell select signal 420 continues to toggle. For example, the signal 520 may cease toggling between T2 and T3. In FIGS. 5A and 5B, the cell select signal 420 is offset from the first voltage level (V0) for clarity purposes, but otherwise the cell select signal 420 may be at or near the first voltage level V0. In FIG. 5B, the cell select signal 420 may be offset from the signal 520, in some instances, for clarity purposes.

At approximately T3, the voltage of the digit line signals 522, 524 and the cell bottom signals 526, 528 may decrease to a lower voltage (e.g., at or near the first voltage level). After the signals 522, 524, 526, 528 are at or near the first voltage level, the cell plate signal 504 may be toggled to a low value (e.g., the first voltage state). In some examples, the time T3 represents the time at which the pre-write operation is complete. In some examples, in response to one or more of these operations, a charge may be transferred (i.e., dumped). The charge dump may represent a read operation performed at the nodes 406, 408. In some embodiments, because the cell plate signal 504 voltage is high, active array cells may be pre-written to a specific data state (e.g., a low data state or a high data state). After the cell plate signal 504 is driven to a low value, the signals 522, 524, 526, 528 may experience a negative voltage spike. After the negative voltage spike, the signals 522, 524, 526, 528 may decrease back to the first voltage level (V0)

In some examples, if no more access operations are to take place at sense amplifier 401 (i.e., the cell select signal 420 no longer toggles), then the isolation signal 440 may be increased (e.g., brought high). In some cases, this may occur immediately after the cell plate signal 504 is decreased down to the lower voltage (e.g., ground). If more access operations are to take place, the isolation signal 440 may be increased at a different time, which may be later (e.g., T4).

After the access operations at the sense amplifier 401 are complete and the pre-write operations at the memory cells are complete, at time T4, the isolation signal 440 may be brought to a high value. In such a manner, the sense amplifier 401 may be reconnected to the memory cells (e.g., connect nodes 405 to nodes 406, 408). Just before the isolation signal 440 is brought high, the EQ signal 418 is changed to a low state, thereby ending the pre-write operation. Once the pre-write is complete, and in order to set up for writing the cells to the opposite state, the EQ signal 418 may be disabled (e.g., changed to a low state), and the isolation signal 440 may be increased in voltage (e.g., taken high). When the isolation signal 440 is increased, the main array digit lines (e.g., nodes 406 and 408) may be reconnected to the nodes 405, causing one or more of the memory cells coupled to the sense amplifier 401 to each be written to the opposite data states. The faster timing described with reference to FIGS. 5A and 5B can be advantageous, for example, in the case where it is desired to activate the same cell repeatedly and quickly (e.g., with a blinking cursor). In some examples, T4 is approximately equal to 100 nanoseconds.

Between T4 and T5, the signal 520, the first digit line signal 522 and at least one of the cell bottom signals 526 or 528 may change over time to be at the seventh voltage level (V1). At T5, the isolation signal 440 may be changed to a low state again, thereby isolating the sense amplifier 401. The signals 520, 522, 526, 528 may discharge to the first voltage level (V0). Sometime after T5, the word line signal 502 may be changed from its high state (e.g., fourth voltage level) to a low state (e.g., first or second voltage states). In some examples, T5 is approximately equal to 145 nanoseconds. In some examples, the portion of the timing diagram 500 between T4 and T5 refers to one side of the sense amplifier 401, specifically when a memory cell coupled to the sense amplifier 401 is to be written to a high value opposite of its pre-written low value. When the sense amplifier 401 is reconnected to the memory cells the signal 520 at one of the nodes 405 is temporarily forced to a lower voltage value.

Figure 6:
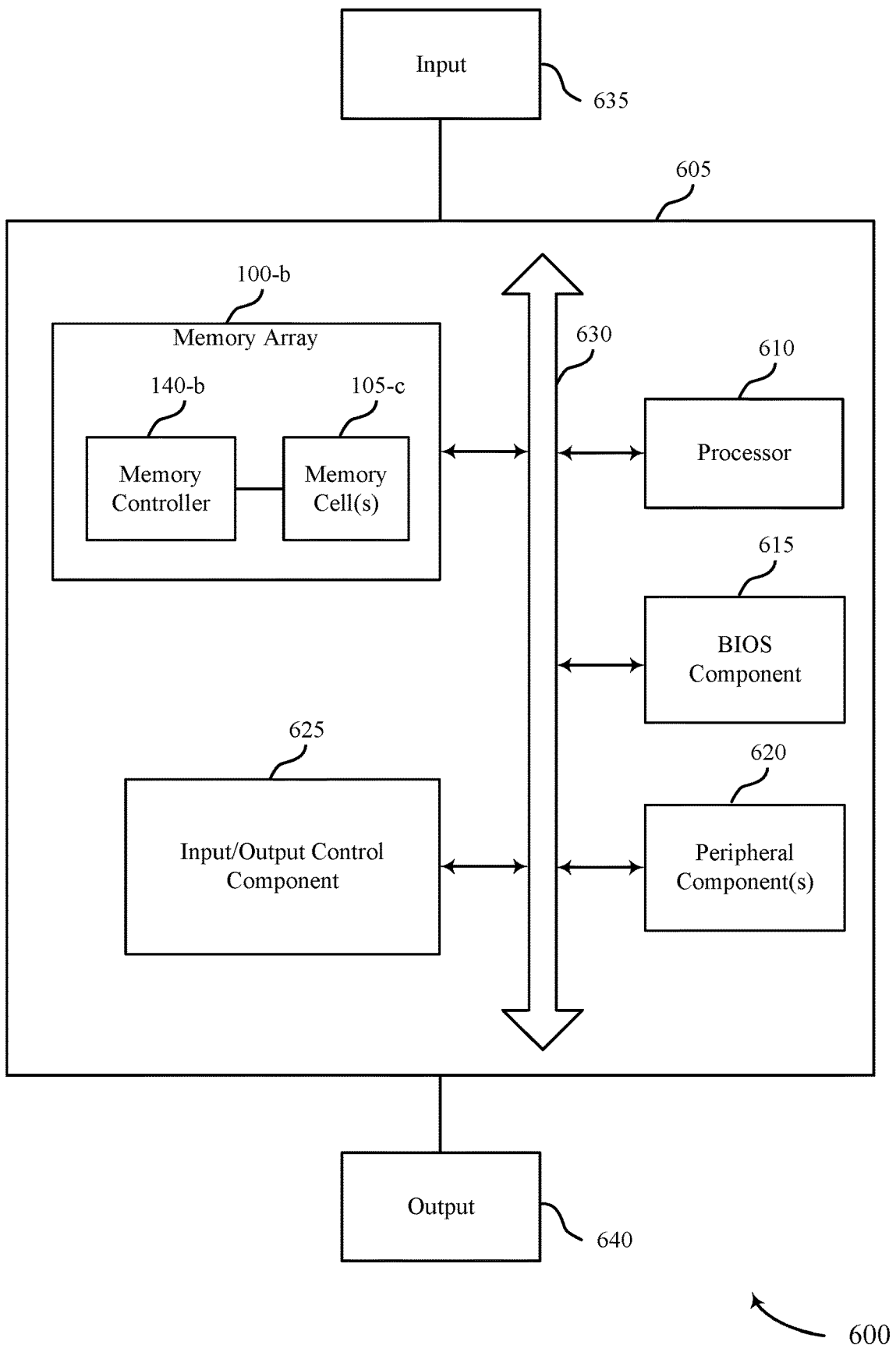
FIG. 6 illustrates a system, including a memory array that supports pre-writing to a low data state, in accordance with various embodiments of the present disclosure.

FIG. 6 illustrates a system 600 that supports pre-writing one or more memory cells (e.g., ferroelectric memory cells) of an array in accordance with various examples of the present disclosure. In some examples, system 600 supports pre-writing one memory cell, multiple memory cells, or all memory cells of an array in accordance with various examples of the present disclosure. System 600 includes a device 605, which may be or include a printed circuit board to connect or physically support various components. Device 605 includes a memory array 100-b, which may be an example of memory array 100 described with reference to FIG. 1. In various examples, device 605 may be a computer, laptop computer, notebook computer, tablet computer, mobile phone, wearable device (e.g., smartwatch, heart rate monitor), another type portable electronic device or the like. Memory array 100-b may contain memory controller 140-b and one or more memory cells 105-c, which may be examples of memory controller 140 described with reference to FIG. 1 and memory cells 105 described with reference to FIGS. 1 and 2. Device 605 may also include a processor 610, BIOS component 615, one or more peripheral components 620, and input/output control component 625. The components of device 605 may be in electronic communication with one another through bus 630.

Processor 610 may be configured to operate memory array 100-b through memory controller 140-b. In some cases, processor 610 may perform the functions of memory controller 140 or 140-a described with reference to FIG. 1. In other cases, memory controller 140-b may be integrated into processor 610. Processor 610 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 610 may perform various functions described herein, including at least some operations initiating or facilitating pre-writing while the sense amplifier is isolated from the memory cells. Processor 610 may, for example, be configured to execute computer-readable instructions stored in memory array 100-b to cause device 605 perform various functions or tasks.

BIOS component 615 may be a software component that includes a basic input/output system (BIOS) operated as firmware, which may initialize and run various hardware components of system 600. BIOS component 615 may also manage data flow between processor 610 and the various components, e.g., peripheral components 620, input/output control component 625, etc. BIOS component 615 may include a program or software stored in read-only memory (ROM), flash memory, or any other non-volatile memory.

Each of one or more peripheral components 620 may be any input or output device, or an interface for such devices, that is integrated into device 605. Examples may include disk controllers, sound controller, graphics controller, Ethernet controller, modem, USB controller, a serial or parallel port, or peripheral card slots, such as peripheral component interconnect (PCI) or accelerated graphics port (AGP) slots.

Input/output control component 625 may manage data communication between processor 610 and one or more peripheral components 620, input devices 635, or output devices 640. Input/output control component 625 may also manage peripherals not integrated into device 605. In some cases, input/output control component 625 may represent a physical connection or port to the external peripheral.

Input devices 635 may represent a device or signal external to device 605 that provides input to device 605 or its components. This may include a user interface or interface with or between other devices. In some cases, input devices 635 may be a peripheral that interfaces with device 605 via one or more peripheral components 620 or may be managed by input/output control component 625.

Output devices 640 may represent a device or signal external to device 605 configured to receive output from device 605 or any of its components. Examples of output devices 640 may include a display, audio speakers, a printing device, another processor or printed circuit board, etc. In some cases, output devices 640 may be a peripheral that interfaces with device 605 via peripheral component(s) 620 or may be managed by input/output control component 625.

The components of memory controller 140-b, device 605, and memory array 100-b may be made up of circuitry designed to carry out their functions. This may include various circuit elements, for example, conductive lines, transistors, capacitors, inductors, resistors, amplifiers, or other active or inactive elements, configured to carry out the functions described herein.

Figure 7:
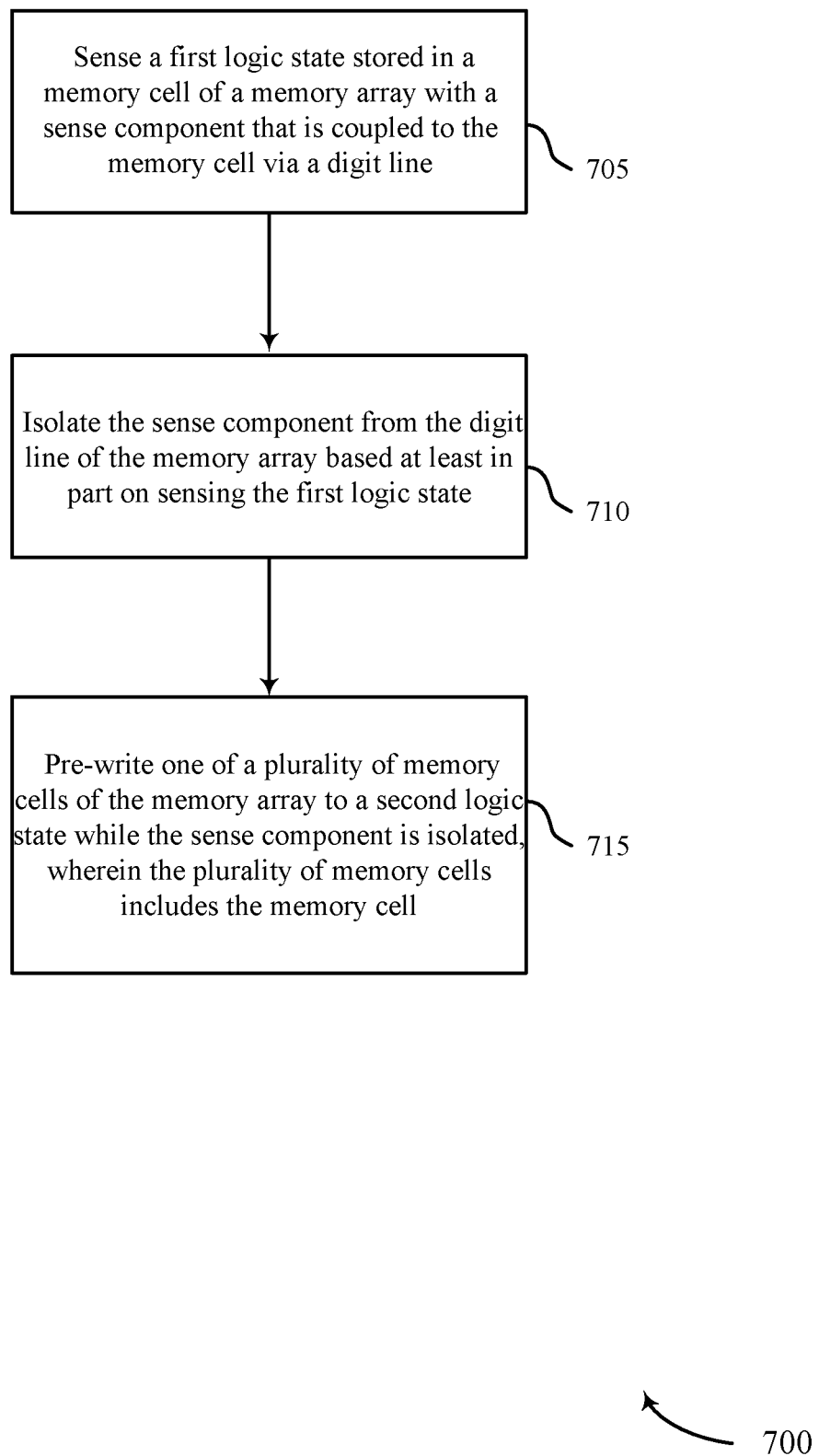
FIG. 7 shows a flowchart illustrating a method of operating an electronic memory apparatus, in accordance with various embodiments of the present disclosure.

FIG. 7 shows a flowchart illustrating a method 700 for pre-writing memory cells of an array in accordance with various embodiments of the present disclosure. The operations of method 700 may be for operating a memory array 100, as described herein. For example, the operations of method 700 may be performed by a memory controller 140 as described with reference to FIGS. 1 and 6. In some examples, a memory controller 140 may execute a set of codes to control the functional elements of the memory array 100 to perform the functions described below. Additionally or alternatively, the memory controller 140 may perform features the functions described below using special-purpose hardware.

At block 705, the memory array 100 may sense a first logic state stored in a memory cell of a memory array with a sense component that is coupled to the memory cell via a digit line. The operations of block 705 may be performed according to the methods described with reference to FIGS. 1 through 5. In some examples, the memory cell or cells may include or be, but are not limited to, a ferroelectric memory cell or ferroelectric memory cells.

At block 710, the memory array 100 may isolate the sense component from the digit line of the memory array based at least in part on sensing the first logic state. In some examples, the isolating the sense component may occur after the sensing of the first logic state. The operations of block 710 may be performed according to the methods described with reference to FIGS. 1 through 5.

At block 715, the memory array 100 may pre-write one of a plurality of memory cells of the memory array to a second logic state while the sense component is isolated, where the plurality of memory cells includes the memory cell. The operations of block 715 may be performed according to the methods described with reference to FIGS. 1 through 5. Pre-writing the plurality of memory cells may include decreasing a voltage of a plurality of digit lines of the memory array to ground while the sense component is isolated, wherein the plurality of digit lines includes the digit line, and writing the plurality of memory cells of the memory array to the second logic state based at least in part on decreasing the voltage of the plurality of digit lines of the memory array to ground.

In some examples, the value of the second logic state may be based at least in part on a voltage of a plate line coupled to the memory cell. In some examples, decreasing the voltage of the plurality of digit lines of the memory array to ground may include activating an equalization device coupled to one of the plurality of digit lines.

In some examples, the method may include deisolating the sense component based at least in part on pre-writing the plurality of memory cells. The method 700 may further include writing the memory cell of the memory array to the first logic state based at least in part on deisolating the sense component. In some examples, the first logic state may be equivalent to the second logic state. In other examples, the first logic state may be different from the second logic state.

Figure 8:
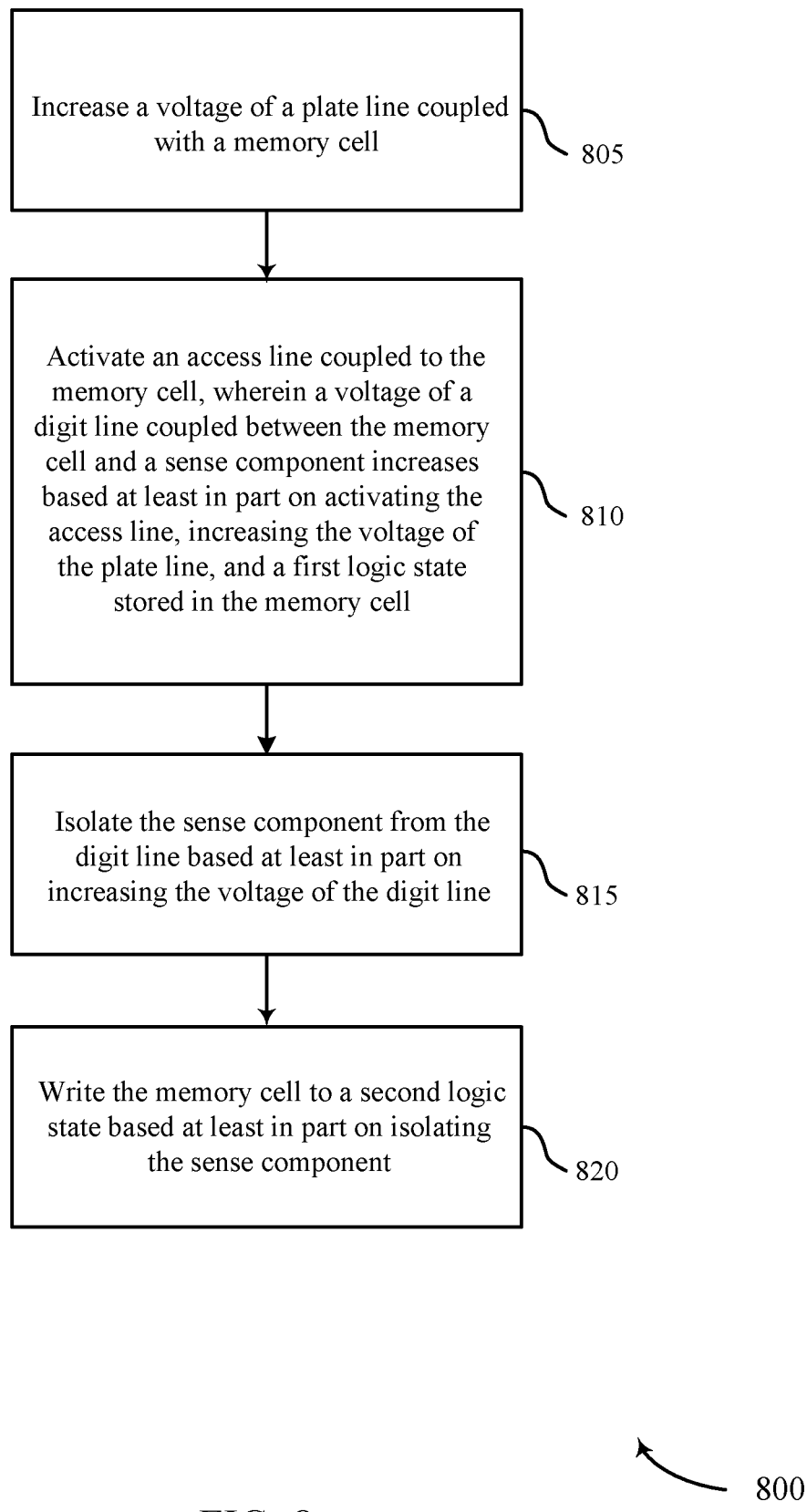
FIG. 8 shows a flowchart illustrating a method of operating an electronic memory apparatus, in accordance with various embodiments of the present disclosure.

FIG. 8 shows a flowchart illustrating a method 800 pre-writing memory cells of an array in accordance with various embodiments of the present disclosure. The operations of method 800 may be for operating a memory array 100, as described herein. For example, the operations of method 800 may be performed by a memory controller 140 as described with reference to FIGS. 1 and 6. In some examples, a memory array 100 may execute a set of codes to control the functional elements of the device to perform the functions described below. Additionally or alternatively, the memory array 100 may perform embodiments the functions described below using special-purpose hardware. In some examples, the memory cell or cells may include or be, but are not limited to, a ferroelectric memory cell or ferroelectric memory cells.

At block 805, the memory array 100 may increase a voltage of a plate line coupled with a memory cell. The operations of block 805 may be performed according to the methods described with reference to FIGS. 1 through 5.

At block 810, the memory array 100 may activate an access line coupled to the memory cell, where a voltage of a digit line coupled between the memory cell and a sense component increases based at least in part on activating the access line, increasing the voltage of the plate line, and a first logic state stored in the memory cell. The operations of block 810 may be performed according to the methods described with reference to FIGS. 1 through 5.

At block 815, the memory array 100 may isolate the sense component from the digit line based at least in part on increasing the voltage of the digit line. The operations of block 815 may be performed according to the methods described with reference to FIGS. 1 through 5.

At block 820, the memory array 100 may write the memory cell to a second logic state based at least in part on isolating the sense component. The operations of block 820 may be performed according to the methods described with reference to FIGS. 1 through 5.

In some cases, the method 800 may include reading or writing at the sense component one or more times while the sense component is isolated from the memory cell. The method 800 may further include decreasing the voltage of the digit line to ground based at least in part on isolating the sense component from the digit line. In some cases, the method 800 may include deisolating the sense component from the memory cell based at least in part on decreasing the voltage of the plate line. In some cases, decreasing the voltage of the plate line is based at least in part on decreasing the voltage of the digit line to ground. Additionally, in some cases, the voltage of the plate line is decreased based at least in part on a voltage at a bottom node of the memory cell decreasing to ground, and the plate line being coupled to a first terminal of the memory cell and the bottom node includes a second terminal of the memory cell. In some cases, the method 800 may include reading and/or writing at the sense component one or more times after decreasing the voltage of the plate line and while the sense component is isolated from the memory cell.

The method 800 may further include activating the access line after the voltage of the plate line satisfies a threshold. In some examples, writing the memory cell to the second logic state comprises writing the memory cell using an equalization device while the sense component is isolated.

The method 800 may further include deisolating the sense component after reading and/or writing at the sense component one or more times. The method 800 may further include writing the memory cell to the first logic state based at least in part on deisolating the sense component.

Thus, methods 700 and 800 may provide for pre-writing one or more memory cells of an array, which may include one or more ferroelectric memory cells. It should be noted that methods 700 and 800 describe possible implementations, and the operations and steps may be rearranged or otherwise modified such that other implementations are possible. In some examples, features from two or more of the methods 700 and 800 may be combined.

The description herein provides examples, and is not limiting of the scope, applicability, or examples set forth in the claims. Changes may be made in the function and arrangement of elements discussed without departing from the scope of the disclosure. Various examples may omit, substitute, and/or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "embodiment," "example," and "exemplary," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" refers to a relationship between components that supports electron flow between the components. This may include a direct connection between components or may include intermediate components. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The term "isolated" refers to a relationship between components in which electrons are not presently flowing between them; components are isolated from each other if there is an open circuit between them. For example, two components physically connected by a switch may be isolated from each other when the switch is open.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media may include both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of a computer-readable medium. Disk and disc, as used herein, may include a compact disk (CD), laser disc, optical disc, digital versatile disc (DVD), floppy disk, and Blu-ray disc. Disks may reproduce data magnetically, while discs may reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method, comprising:
   pre-writing a plurality of memory cells of a memory array to a first logic state while a sense component is isolated from one or more digit lines;
   coupling the sense component with the one or more digit lines based at least in part on pre-writing the plurality of memory cells; and
   writing a portion of the plurality of memory cells to a second logic state based at least in part on the coupling the sense component with the one or more digit lines.

2. The method of claim 1, further comprising:
   maintaining a second portion of the plurality of memory cells at the first logic state based at least in part on coupling the sense component with the one or more digit lines.

3. The method of claim 2, further comprising:
   sensing the first logic state stored on the second portion of the plurality of memory cells before pre-writing the plurality of memory cells, wherein maintaining the second portion of the plurality of memory cells at the first logic state is based at least in part on sensing the first logic state.

4. The method of claim 1, further comprising:
   isolating the sense component from the one or more digit lines of the memory array before pre-writing the plurality of memory cells, wherein pre-writing the plurality of memory cells is based at least in part on isolating the sense component from the one or more digit lines.

5. The method of claim 1, further comprising:
   sensing the second logic state stored on the portion of the plurality of memory cells before pre-writing the plurality of memory cells, wherein writing the portion of the plurality of memory cells to the second logic state is based at least in part on sensing the second logic state stored on the portion of the plurality of memory cells.

6. The method of claim 1, wherein pre-writing the plurality of memory cells comprises:
   decreasing a first voltage of the one or more digit lines of the memory array to ground while the sense component is isolated from the one or more digit lines; and
   writing the plurality of memory cells of the memory array to the first logic state based at least in part on decreasing the first voltage of the one or more digit lines to ground.

7. The method of claim 6, further comprising:
   biasing a plate line to a second voltage, wherein a value of the first logic state is based at least in part on biasing the plate line to the second voltage.

8. The method of claim 1, further comprising:
   activating an equalization device coupled with the one or more digit lines, wherein pre-writing the plurality of memory cells is based at least in part on activating the equalization device.

9. The method of claim 1, wherein the first logic state is different than the second logic state.

10. An apparatus, comprising:
    a memory array comprising a plurality of memory cells;
    a sense component in electronic communication with the plurality of memory cells via one or more digit lines; and
    a controller in electronic communication with the memory array and the sense component, wherein the controller is operable to:
    pre-write the plurality of memory cells of the memory array to a first logic state while the sense component is isolated from the one or more digit lines;
    couple the sense component with the one or more digit lines based at least in part on pre-writing the plurality of memory cells; and
    write a portion of the plurality of memory cells to a second logic state based at least in part on the coupling the sense component with the one or more digit lines.

11. The apparatus of claim 10, wherein the controller is operable to:
    maintain a second portion of the plurality of memory cells at the first logic state based at least in part on coupling the sense component with the one or more digit lines.

12. The apparatus of claim 11, wherein the controller is operable to:
    sense the first logic state stored on the second portion of the plurality of memory cells before pre-writing the plurality of memory cells, wherein maintaining the second portion of the plurality of memory cells at the first logic state is based at least in part on sensing the first logic state.

13. The apparatus of claim 10, wherein the controller is operable to:
    isolate the sense component from the one or more digit lines of the memory array before pre-writing the plurality of memory cells, wherein pre-writing the plurality of memory cells is based at least in part on isolating the sense component from the one or more digit lines.

14. The apparatus of claim 10, wherein the controller is operable to:
    sense the second logic state stored on the portion of the plurality of memory cells before pre-writing the plurality of memory cells, wherein writing the portion of the plurality of memory cells to the second logic state is based at least in part on sensing the second logic state stored on the portion of the plurality of memory cells.

15. The apparatus of claim 10, wherein the controller is operable to:
   decrease a first voltage of the one or more digit lines of the memory array to ground while the sense component is isolated from the one or more digit lines; and
   write the plurality of memory cells of the memory array to the first logic state based at least in part on decreasing the first voltage of the one or more digit lines to ground.

16. The apparatus of claim 10, wherein the controller is operable to:
   bias a plate line to a second voltage, wherein a value of the first logic state is based at least in part on biasing the plate line to the second voltage.

17. A method, comprising:
   adjusting a first signal associated with one or more isolation devices from a first value to a second value to isolate a sense component from a memory cell coupled with the sense component;
   activating a second signal associated with one or more equalization devices to bring a digit line of the memory cell to a first voltage, wherein the one or more equalization devices are configured to pre-write the memory cell to a first state based at least in part on activating the second signal;
   toggling a third signal associated with the sense component to perform one or more access operations at the sense component; and
   adjusting the first signal to the first value to couple the sense component to the memory cell, wherein a second state is written to the memory cell based at least in part on coupling the sense component to the memory cell.

18. The method of claim 17, wherein the third signal is toggled to an opposite polarity after activating the second signal, wherein the third signal comprises a cell select signal.

19. The method of claim 17, further comprising:
   disabling the second signal associated with the one or more equalization devices to bring the digit line to a second voltage, wherein the second voltage is different from the first voltage, wherein adjusting the first signal to the first value is based at least in part on disabling the second signal.

20. The method of claim 17, wherein the memory cell is an active memory cell of an open page.

* * * * *